(12) United States Patent
Yoo et al.

(10) Patent No.: US 8,916,911 B2
(45) Date of Patent: Dec. 23, 2014

(54) SEMICONDUCTOR DEVICES HAVING BACKSIDE ILLUMINATED IMAGE SENSORS

(75) Inventors: Gil-Sang Yoo, Bucheon-si (KR);
Chang-Rok Moon, Seocho-gu (KR);
Byung-Jun Park, Yongin-si (KR);
Sang-Hoon Kim, Seongnam-si (KR);
Seung-Hun Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 625 days.

(21) Appl. No.: 13/180,898

(22) Filed: Jul. 12, 2011

(65) Prior Publication Data

US 2012/0091515 A1    Apr. 19, 2012

(30) Foreign Application Priority Data

Oct. 13, 2010   (KR) ........................ 10-2010-0099823

(51) Int. Cl.
*H01L 27/148*    (2006.01)
*H01L 27/146*    (2006.01)
*H04N 5/225*     (2006.01)

(52) U.S. Cl.
CPC .... *H01L 27/14636* (2013.01); *H01L 27/14645* (2013.01); *H01L 27/14603* (2013.01); *H01L 27/14618* (2013.01); *H01L 27/1464* (2013.01); *H01L 27/14689* (2013.01); *H04N 5/2253* (2013.01); *H04N 5/2254* (2013.01)
USPC .......................................... 257/225; 257/222

(58) Field of Classification Search
CPC ................... H01L 27/14645; H01L 27/14603; H01L 27/1464
USPC .................................................. 257/222, 225
See application file for complete search history.

(56) References Cited

U.S. PATENT DOCUMENTS

| | | | |
|---|---|---|---|
| 5,608,264 A * | 3/1997 | Gaul | 257/734 |
| 7,045,380 B2 * | 5/2006 | Kim | 438/48 |
| 7,145,189 B2 * | 12/2006 | Mouli | 257/225 |
| 7,666,757 B2 * | 2/2010 | Ohnuma | 438/455 |
| 7,947,528 B2 * | 5/2011 | Iwabuchi et al. | 438/98 |
| 8,541,878 B2 * | 9/2013 | Takahashi et al. | 257/760 |
| 2002/0066930 A1 * | 6/2002 | Terashima | 257/356 |
| 2002/0096778 A1 * | 7/2002 | Cox | 257/774 |
| 2009/0146148 A1 | 6/2009 | Pyo | |

FOREIGN PATENT DOCUMENTS

| | | |
|---|---|---|
| KR | 1020090033636 | 4/2009 |
| KR | 1020090035262 | 4/2009 |
| KR | 100938723 | 1/2010 |

\* cited by examiner

*Primary Examiner* — Nicholas Tobergte
(74) *Attorney, Agent, or Firm* — Harness, Dickey & Pierce, P.L.C.

(57) ABSTRACT

A semiconductor substrate includes a photodiode on a support substrate. An insulating layer is provided between the support substrate and the semiconductor substrate. A first conductive pattern is provided in the insulating layer. A first through electrode penetrates the support substrate to be in contact with the first conductive pattern.

20 Claims, 11 Drawing Sheets

FIG. 20

SEMICONDUCTOR DEVICES HAVING BACKSIDE ILLUMINATED IMAGE SENSORS

CROSS-REFERENCE TO RELATED APPLICATION

This application claims priority under 35 U.S.C. §119 to Korean Patent Application No. 10-2010-0099823 filed on Oct. 13, 2010, the disclosure of which is hereby incorporated by reference in its entirety.

BACKGROUND

1. Field

Example embodiments of inventive concepts relate to semiconductor devices having backside illuminated image sensors and/or methods of fabricating the same.

2. Description of Related Art

Methods of decreasing size and increasing operating speeds in semiconductor devices having backside illuminated image sensors have been studied.

SUMMARY

Example embodiments of inventive concepts provide semiconductor devices having improved integration density and/or operating speed characteristics, and methods of fabricating the same.

Example embodiments of inventive concepts also provide camera modules and electronic systems employing semiconductor devices having improved integration density and/or operating speed characteristics.

At least one example embodiment provides an image sensor. The image sensor includes a support substrate and a semiconductor substrate on the support substrate. The semiconductor substrate includes a photodiode. An insulating layer is provided between the support substrate and the semiconductor substrate. A first conductive pattern is provided in the insulating layer. A first through electrode penetrates the support substrate to contact the first conductive pattern.

According to at least some example embodiments, the semiconductor substrate may include a pixel region having the photodiode, and a logic region adjacent to the pixel region. The first through electrode may be arranged in the logic region.

A lower input/output pad may be formed on the support substrate and connected to the first through electrode. The first through electrode may be disposed between the lower input/output pad and the first conductive pattern.

A second conductive pattern may be provided in the insulating layer. A second through electrode may penetrate the semiconductor substrate to contact the second conductive pattern. An upper input/output pad may be formed on the semiconductor substrate and connected to the second through electrode. The second through electrode may be disposed between the upper input/output pad and the second conductive pattern. The second through electrode may be arranged in the logic region.

The first through electrode may be separated from the semiconductor substrate, and the second through electrode may be separated from the support substrate.

According to at least some example embodiments, a third conductive pattern may be disposed in the insulating layer. A third through electrode may penetrate the support substrate to contact the third conductive pattern. The third through electrode may be arranged in the pixel region.

According to at least some example embodiments, the first through electrode may penetrate the support substrate and a portion of the insulating layer between the support substrate and the first conductive pattern. The first through electrode may be recessed in a surface of the first conductive pattern. The image sensor may further include an insulating spacer covering sidewalls of a first through hole in which the first through electrode is formed. The insulating spacer may extend from the lower input/output pad to the first conductive pattern.

According to at least some example embodiments, the photodiode may include first and second pinned photo diode (PPD) regions having p-type impurities, and an N photo diode (NPD) region having n-type impurities between the first and second PPD regions. The first PPD region may be arranged between the NPD region and the insulating layer.

At least one micro-lens may be provided on the photodiode, and at least one color filter may be disposed between the at least one micro-lens and the second PPD region.

An isolation region may be provided in the semiconductor substrate. The isolation region may contact the photodiode. The isolation region may include a semiconductor material having p-type impurities.

A floating diffusion region may be formed adjacent to the photodiode in the semiconductor substrate. A gate electrode may be disposed in the insulating layer. The floating diffusion region may be separated from the photodiode, and the gate electrode may be arranged between the photodiode and the floating diffusion region.

A bonding layer may be disposed between the support substrate and the insulating layer. The bonding layer may include a silicon oxide layer.

At least one other example embodiment provides a semiconductor device. The semiconductor device includes a support substrate and a bonding layer disposed on the support substrate. An insulating layer is disposed on the bonding layer, and first and second conductive patterns are disposed in the insulating layer. A semiconductor substrate is provided on the insulating layer. A first through electrode penetrates the support substrate to contact the first conductive pattern. A second through electrode penetrates the semiconductor substrate to contact the second conductive pattern.

According to at least some example embodiments, a gate electrode may be disposed in the insulating layer. Source and drain regions may be provided in the semiconductor substrate adjacent to respective sides of the gate electrode.

A through hole may penetrate the support substrate and a portion of the insulating layer between the support substrate and the first conductive pattern. The through hole may also form recess in a surface of the first conductive pattern. An insulating spacer may cover sidewalls of the through hole. The first through electrode may fill the through hole, and the insulating spacer may extend from the lower input/output pad to the first conductive pattern. The first through electrode may be recessed in the surface of the first conductive pattern.

At least one other example embodiment provides a camera module. The camera module includes a case having a light transmitting window. A printed circuit board is mounted in the case. A support substrate is mounted on the printed circuit board in the case. A semiconductor substrate having a photodiode is provided on the support substrate. An insulating layer is disposed between the support substrate and the semiconductor substrate. A first conductive pattern is disposed in the insulating layer. A first through electrode penetrates the support substrate and contacts the first conductive pattern. The light transmitting window is arranged on the photodiode.

According to at least some example embodiments, a contact portion may be disposed between the printed circuit board and the first through electrode. The contact portion may be formed of a conductive bump, a solder ball, an anisotropic conductive paste (ACP), an anisotropic conductive film (ACF), a non conductive paste (NCP), a non conductive film (NCF), a combination thereof or the like.

According to at least some example embodiments, a second conductive pattern may be disposed in the insulating layer. A second through electrode may penetrate the semiconductor substrate to contact the second conductive pattern. An upper input/output pad may be connected to the second through electrode and formed on the semiconductor substrate. A connection portion may be connected to the upper input/output pad and the printed circuit board. The second through electrode may be disposed between the upper input/output pad and the second conductive pattern, and the connection portion may be formed of a bonding wire, a beam lead, a conductive tape, a combination thereof or the like.

At least one other example embodiment provides a semiconductor device having a photo-sensing region and a logic region adjacent to the photo-sensing region. The semiconductor device includes: a support substrate; a semiconductor substrate on the support substrate; and a first through electrode formed in a first through hole through the support substrate in the logic region. The semiconductor substrate includes a photodiode in the photo-sensing region. The first through electrode electrically connects a first conductive pattern at a first surface of the support substrate with a first input/output pad at a second surface of the support substrate.

The first through hole may partially penetrate the first conductive pattern to form a recess in a surface of the first conductive pattern.

According to at least some example embodiments, the first surface and the second surfaces may be opposite to one another. The semiconductor device may further include: an insulating layer arranged between the support substrate and the semiconductor substrate. The first conductive pattern may be formed in the insulating layer.

The photodiode may include first and second pinned photodiode regions having a first type of impurities, and a third photodiode region having a second type of impurities. The first and second type of impurities may be different. The third photodiode region may be arranged between the first and second pinned photodiode regions. The first pinned photodiode region may be arranged between the third photodiode region and the insulating layer.

The semiconductor device may further include: at least one micro-lens disposed on the photodiode; and at least one color filter disposed between the at least one micro-lens and the second PPD region.

Detailed particulars of other example embodiments may be included in the detailed description of the drawings.

BRIEF DESCRIPTION OF THE DRAWINGS

Inventive concepts will be apparent from the more particular description of example embodiments with regard to the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thickness of layers and regions may be exaggerated for clarity. Also, when it is referred that a layer is "on" another layer or a substrate, it may be directly formed on another layer or the substrate or a third layer may be interposed therebetween. Like reference numerals designate like elements throughout the specification.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Relative terms such as "below" or "above" or "upper" or "lower" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 1:
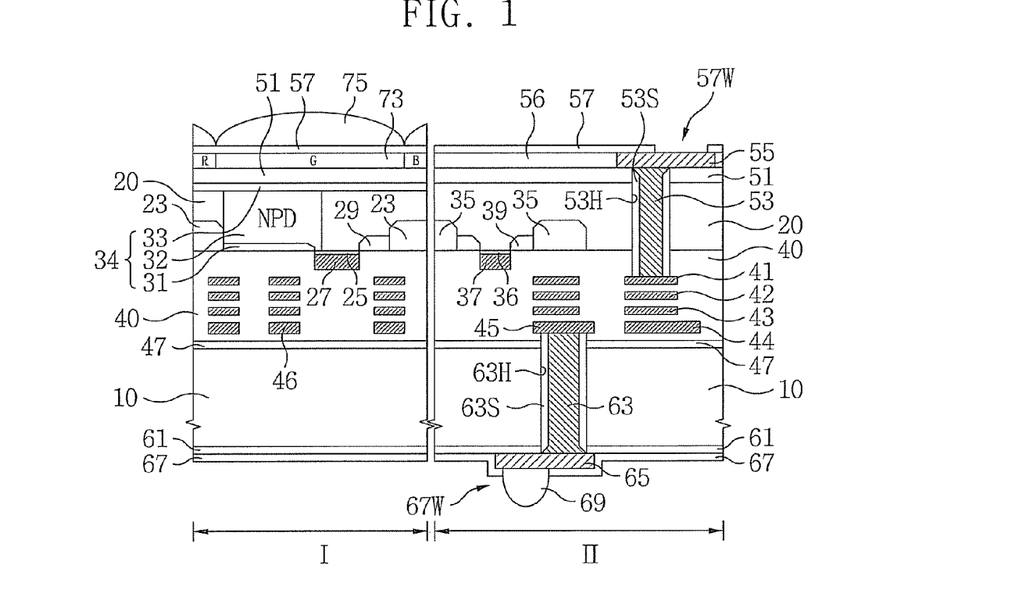
FIG. 1 is a cross-sectional view of a semiconductor device according to an example embodiment of inventive concepts.

FIG. 1 is a cross-sectional view of a semiconductor device according to an example embodiment of inventive concepts. The device shown in FIG. 1 includes a backside illuminated image sensor.

Referring to FIG. 1, the semiconductor device includes a support substrate 10 and a semiconductor substrate 20 facing each other. A first insulating layer 40 is formed on a surface of the semiconductor substrate 20 between the semiconductor substrate 20 and the support substrate 10. A plurality of conductive patterns 41, 42, 43, 44, 45 and 46 are formed in the first insulating layer 40. Of the plurality of conductive patterns, a first conductive pattern 45 is formed adjacent to the support substrate 10, whereas a second conductive pattern 41 is formed adjacent to the semiconductor substrate 20. A bonding layer 47 is interposed between the support substrate 10 and the first insulating layer 40. The bonding layer 47 bonds the first insulating layer 40 and the semiconductor substrate 20 to the support substrate 10.

The semiconductor device shown in FIG. 1 includes a first region I and a second region II. The second region II is adjacent to the first region I. In FIG. 1, the first region I is a pixel region, and the second region II is a logic region. The first region I may be an active pixel sensor (APS) region.

The support substrate 10 may be formed of a semiconductor substrate, a glass plate, a metal plate or the like. The example embodiment shown in FIG. 1 will be described assuming that the support substrate 10 is formed of a semiconductor substrate having a thickness of between about 100 μm and about 800 μm, inclusive. In one example, the support substrate 10 may be formed of a silicon wafer having a thickness of about 720 μm.

The semiconductor substrate 20 may be formed of a single crystalline semiconductor such as a silicon wafer having p-type impurities. The semiconductor substrate 20 may be formed to a thickness of between about 1 μm and about 10 μm, inclusive. According to at least one example embodiment, the semiconductor substrate 20 may be formed to a thickness of about 3 μm. The first insulating layer 40 may include a silicon oxide layer, a silicon nitride layer, a silicon oxynitride layer, a combination thereof or the like. The bonding layer 47 may be a silicon oxide or similar layer. The conductive patterns 41, 42, 43, 44, 45 and 46 may be metal layers, metal silicide layers, polysilicon layers, a combination thereof or the like.

Still referring to FIG. 1, a first gate electrode 27 is disposed on a portion of the semiconductor substrate 20 in the first region I. A first gate dielectric layer 25 is interposed between the first gate electrode 27 and the semiconductor substrate 20. The first insulating layer 40 covers the first gate electrode 27 and the first gate dielectric layer 25. The first gate electrode 27 may be a transfer gate electrode. In one example, the first gate electrode 27 may be formed of a polysilicon layer, a metal layer, a metal silicide layer, a combination thereof or the like. The first gate dielectric layer 25 may be a silicon oxide layer, a silicon nitride layer, a silicon oxynitride layer, a high-K dielectric layer, a combination thereof or the like.

Still referring to FIG. 1, a photodiode 34 is disposed in the semiconductor substrate 20 in the first region I. The photodiode 34 is formed adjacent to a side of the first gate electrode 27. A floating diffusion region 29 is disposed in the semiconductor substrate 20 in the first region I. The floating diffusion region 29 is adjacent to the other side of the first gate electrode 27 and faces the photodiode 34. In one example, the floating diffusion region 29 may include n-type impurities. A portion of the semiconductor substrate 20 remains between the photodiode 34 and the floating diffusion region 29.

The photodiode 34 includes a first pinned photo diode (PPD) region 31, an N photo diode (NPD) region 32, and a second PPD region 33. The NPD region 32 is disposed between the first PPD region 31 and the second PPD region 33. The first PPD region 31 is disposed between the NPD region 32 and the first insulating layer 40. In the example embodiment shown in FIG. 1, the first PPD region 31 and the second PPD region 33 is thinner than the NPD region 32, and the first PPD region 31 is narrower in width than the NPD region 32. The second PPD region 33 has a width greater than the first PPD region 31 and the NPD region 32. In the example embodiment shown in FIG. 1, the second PPD region 33 covers an upper surface of the semiconductor substrate 20 in the first region I.

The NPD region 32 may include a semiconductor having n-type impurities. The first PPD region 31 and the second PPD region 33 may include a semiconductor having p-type impurities.

The photodiode 34 and the floating diffusion region 29 are defined by a first isolation region 23. The first isolation region 23 contacts a sidewall of the photodiode 34. A portion of the semiconductor substrate 20 remains between a portion of the first isolation region 23 and the second PPD region 33. The first gate electrode 27 is arranged in an upper portion of the insulating layer 40 between the photodiode 34 and the floating diffusion region 29. In the example embodiment shown in FIG. 1, the first isolation region 23 is a shallow trench isolation (STI) region. The first isolation region 23 may be formed of a silicon oxide layer, a silicon nitride layer, a silicon oxynitride layer, a combination thereof or the like.

A second insulating layer 51 is formed to cover a surface of the semiconductor substrate 20. As shown in FIG. 1, the semiconductor substrate 20 is interposed between the first insulating layer 40 and the second insulating layer 51. The second insulating layer 51 may be a silicon oxide layer, a silicon nitride layer, a silicon oxynitride layer, a combination thereof or the like. The second insulating layer 51 covers the second PPD region 33.

Color filters 73 are disposed on the second insulating layer 51 in the first region I. A third insulating layer 57 is formed on the color filters 73. Micro-lenses 75 are arranged on the color filters 73. Each micro-lens 75 is arranged over a corresponding one of the color filters 73 and photodiodes 34. The third insulating layer 57 may be a silicon oxide layer, a silicon nitride layer, a silicon oxynitride layer, a combination thereof or the like.

Still referring to FIG. 1, some of the conductive patterns 41, 42, 43, 44, 45 and 46 are formed in the second region II. As shown, the first conductive pattern 45 is disposed adjacent to the support substrate 10 in the second region II. The second conductive pattern 41 is disposed adjacent to the semiconductor substrate 20 in the second region II.

A second gate electrode 37 is formed on a surface of the semiconductor substrate 20 in the second region II. A second gate dielectric layer 36 is interposed between the second gate electrode 37 and the semiconductor substrate 20. Source and drain regions 39 are formed in the semiconductor substrate 20 adjacent to respective sides of the second gate electrode 37. A portion of the semiconductor substrate 20 remains between the source and drain regions 39. The source and drain regions 39 are defined by a second isolation region 35. The second isolation region 35 contacts the sidewalls of the source and drain regions 39. The second gate electrode 37 is arranged on the semiconductor substrate between the source and drain regions 39.

The second insulating layer 51 is formed to cover a surface of the semiconductor substrate 20. In this example, the semiconductor substrate 20 in the second region II is interposed between the first insulating layer 40 and the second insulating layer 51. A fourth insulating layer 56 is formed on a portion of the second insulating layer 51 in the second region II. A third insulating layer 57 is formed to cover the fourth insulating layer 56. In at least some other example embodiments, the third insulating layer 57 may be referred to as a fourth insulating layer, and the fourth insulating layer 56 may be referred to as a third insulating layer.

The second gate electrode 37 may be formed of a polysilicon layer, a metal layer, a metal silicide layer, a combination thereof or the like. The second gate dielectric layer 36 may be a silicon oxide layer, a silicon nitride layer, a silicon oxynitride layer, a high-K dielectric layer, a combination thereof or the like. The second isolation region 35 may be an STI region. The second isolation region 35 may be formed of a silicon oxide layer, a silicon nitride layer, a silicon oxynitride layer, a combination thereof or the like. The fourth insulating layer 56 may be a silicon oxide layer, a silicon nitride layer, a silicon oxynitride layer, a combination thereof or the like.

Still referring to FIG. 1, a fifth insulating layer 61 is formed on the surface of the support substrate 10 opposite to the insulating layer 40. In this example, the fifth insulating layer 61 covers both the first region I and the second region II. The support substrate 10 is interposed between the fifth insulating layer 61 and the bonding layer 47. The fifth insulating layer 61 may be a silicon oxide layer, a silicon nitride layer, a silicon oxynitride layer, a combination thereof or the like.

A sixth insulating layer 67 is formed on the fifth insulating layer 61. The sixth insulating layer 67 may be a silicon oxide layer, a silicon nitride layer, a silicon oxynitride layer, a combination thereof or the like.

The semiconductor device shown in FIG. 1 further includes a first through electrode 63 and a second through electrode 53 formed in the second region II. A lower input/output pad 65 is formed on the first through electrode 63, and an upper input/output pad 55 is formed on the second through electrode 53. A contact portion 69 is attached to the lower input/output pad 65.

In the example embodiment shown in FIG. 1, a first through hole 63H is formed through the fifth insulating layer 61, the support substrate 10, the bonding layer 47 and a portion of the first insulating layer 40 between the lower input/output pad 65 and the first conductive pattern 45. A first insulating spacer 63S is formed on sidewalls of the first through hole 63H. The first through electrode 63 is formed to fill (e.g., completely fill) the first through hole 63H, thereby electrically connecting the lower input/output pad 65 with the first conductive pattern 45. In this example, the first insulating spacer 63S surrounds sidewalls of the first through electrode 63. The first insulating spacer 63S insulates the first through electrode 63 from the support substrate 10. The first through electrode 63 is separated from the semiconductor substrate 20 by the first insulating layer 40.

The lower input/output pad 65 is disposed on the fifth insulating layer 61 and contacts the first through electrode 63. The first through electrode 63 is disposed between the lower input/output pad 65 and the first conductive pattern 45. The lower input/output pad 65 is covered with the sixth insulating layer 67. The sixth insulating layer 67 has a first opening 67W partially exposing the lower input/output pad 65. The contact portion 69 is formed in the first opening 67W to contact the lower input/output pad 65.

A second through hole 53H is formed through the second insulating layer 51, the semiconductor substrate 20 and a portion of the insulating layer 40 between the upper input/output pad 55 and the second conductive pattern 41. A second insulating spacer 53S covers the sidewalls of the second through hole 53H. The second through electrode 53 is formed to fill (e.g., completely fill) the second through hole 53H. In this example, the second insulating spacer 53S surrounds sidewalls of the second through electrode 53. The second through electrode 53 is insulated from the semiconductor substrate 20 by the second insulating spacer 53S. The second through electrode 53 is separated from the support substrate 10 by the first insulating layer 40.

The upper input/output pad 55 is formed on the second insulating layer 51 and contacts the second through electrode 53. The second through electrode 53 is disposed between the upper input/output pad 55 and the second conductive pattern 41. The upper input/output pad 55 is formed in the fourth insulating layer 56. The third insulating layer 57 is formed to cover the upper input/output pad 55. The third insulating layer 57 has a second opening 57W partially exposing the upper input/output pad 55.

The first insulating spacer 63S and the second insulating spacer 53S may be formed of a silicon oxide layer, a silicon nitride layer, a silicon oxynitride layer, a combination thereof or the like. The first through electrode 63, the second through electrode 53, the lower input/output pad 65 and the upper input/output pad 55 may be formed of a metal layer, a metal silicide layer, a semiconductor layer, a conductive carbon layer, a combination thereof or the like. The contact portion 69 may be a conductive bump, a solder ball, an anisotropic conductive paste (ACP), an anisotropic conductive film (ACF), a non conductive paste (NCP), a non conductive film (NCF), a combination thereof or the like.

As described above, the lower input/output pad 65 is electrically connected to the first conductive pattern 45 via the first through electrode 63, and the upper input/output pad 55 is electrically connected to the second conductive pattern 41 via the second through electrode 53. According to at least the example embodiment shown in FIG. 1, the configuration of the lower input/output pad 65, the upper input/output pad 55, the first through electrode 63 and the second through electrode 53 may increase integration density compared to the conventional art. Furthermore, a signal transmission path via the first through electrode 63 and the second through electrode 53 may be shortened (e.g., significantly shortened) compared to the conventional art. Consequently, an electrical signal generated from the photodiode 34 may be output more promptly.

FIGS. 2 to 5 are cross-sectional views of semiconductor devices according to other example embodiments. The example embodiments shown in FIGS. 2 to 5 are similar to the example embodiment shown in FIG. 1. Thus, the description of these figures will focus on the differences between the example embodiment shown in FIG. 1 and the example embodiments shown in FIGS. 2 to 5.

Figure 2:
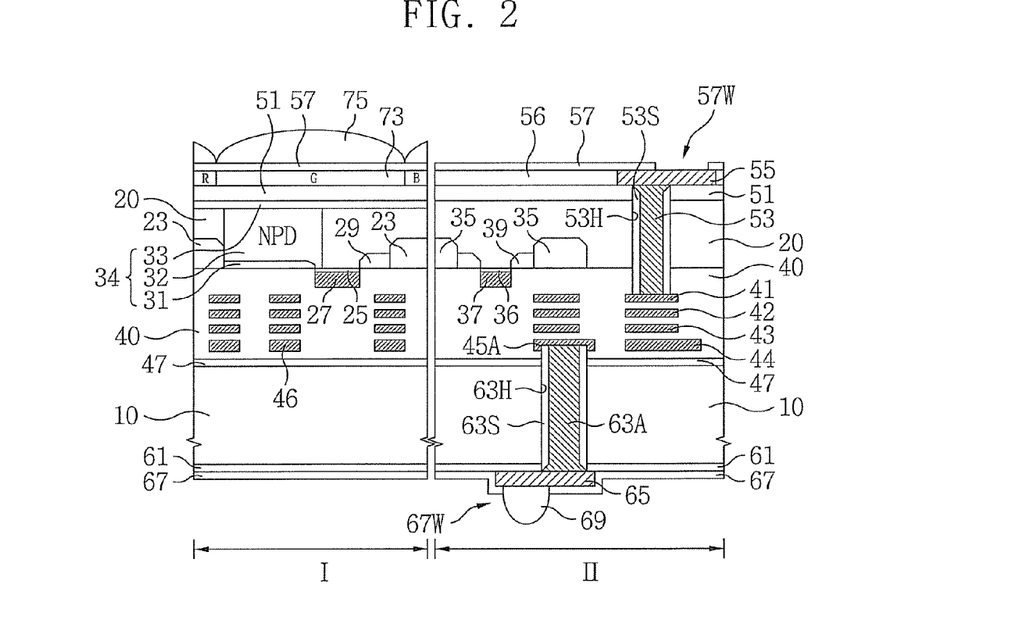
FIGS. 2 to 5 are cross-sectional views of semiconductor devices according to other example embodiments of inventive concepts.

Referring to FIG. 2, in the second region II, a first through hole 63H is formed through the fifth insulating layer 61, the support substrate 10, the bonding layer 47 and a portion of the first insulating layer 40 between the lower input/output pad 65 and the first conductive pattern 45A. A surface of the first conductive pattern 45A is also partially recessed by the first through hole 63H. A first insulating spacer 63S covers sidewalls of the first through hole 63H. A first through electrode 63A is formed to fill (e.g., completely fill) the first through hole 63H. In this example, the first insulating spacer 63S surrounds sidewalls of the first through electrode 63A between the lower input/output pad 65 and the first conductive pattern 45A.

Figure 3:
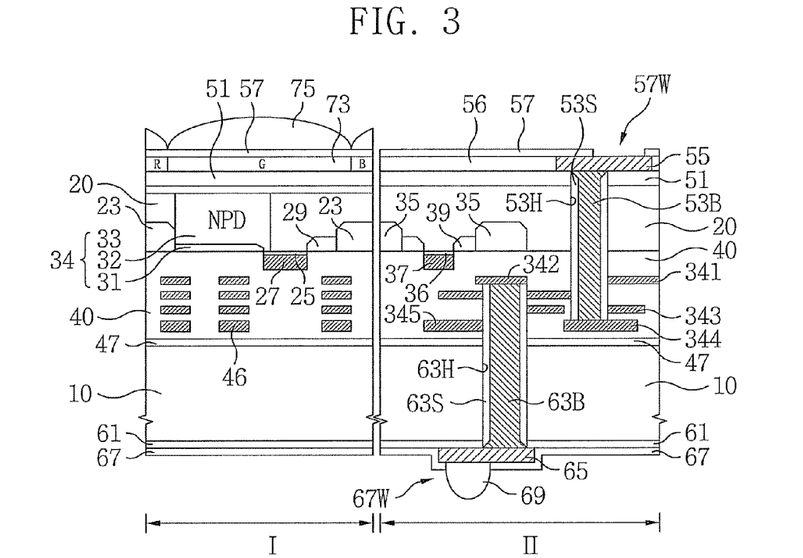

Referring to FIG. 3, a plurality of conductive patterns 341, 342, 343, 344, 345 and 346 are provided in a first insulating layer 40. The conductive patterns 341, 342, 343, 344, 345 and 346 in the first insulating layer 40 constitute a plurality of interconnection layers. For example, the conductive patterns 341, 342, 343, 344, 345 and 346 constitute first to fourth interconnection layers. The conductive patterns 341, 342, 343, 344, 345 and 346 include a first conductive pattern 341, a second conductive pattern 342, a third conductive pattern 343, a fourth conductive pattern 344, a fifth conductive pattern 345 and a sixth conductive pattern 346. The fourth conductive pattern 344 and the fifth conductive pattern 345 are disposed on a first interconnection layer adjacent to the support substrate 10 of the second region II. The third conductive pattern 343 is disposed on a second interconnection layer. The first conductive pattern 341 and the second conductive pattern 342 are disposed on a fourth interconnection layer adjacent to a semiconductor substrate 20 in the second region II.

A first through hole 63H is formed through the fifth insulating layer 61, the support substrate 10, the bonding layer 47 and a portion of the first insulating layer 40 between the lower input/output pad 65 and the second conductive pattern 342. In this example, the first through hole 63H is formed through the first to third interconnection layers. A first insulating spacer 63S covers sidewalls of the first through hole 63H. A first through electrode 63B is formed to fill (e.g., completely fill) the first through hole 63H. The first through electrode 63B contacts the second conductive pattern 342 of the fourth interconnection layer.

A second through hole 53H is formed through the second insulating layer 51, the semiconductor substrate 20 and a portion of the first insulating layer 40 between the upper input/output pad 55 and the fourth conductive pattern 344. A second insulating spacer 53S covers sidewalls of the second through hole 53H. A second through electrode 53B is formed to fill (e.g., completely fill) the second through hole 53H. The second through electrode 53B contacts the fourth conductive pattern 344 of the first interconnection layer and the upper input/output pad 55.

In alternative example embodiments, the first through electrode 63B and the second through electrode 53B may contact one of other interconnection layers.

Figure 4:
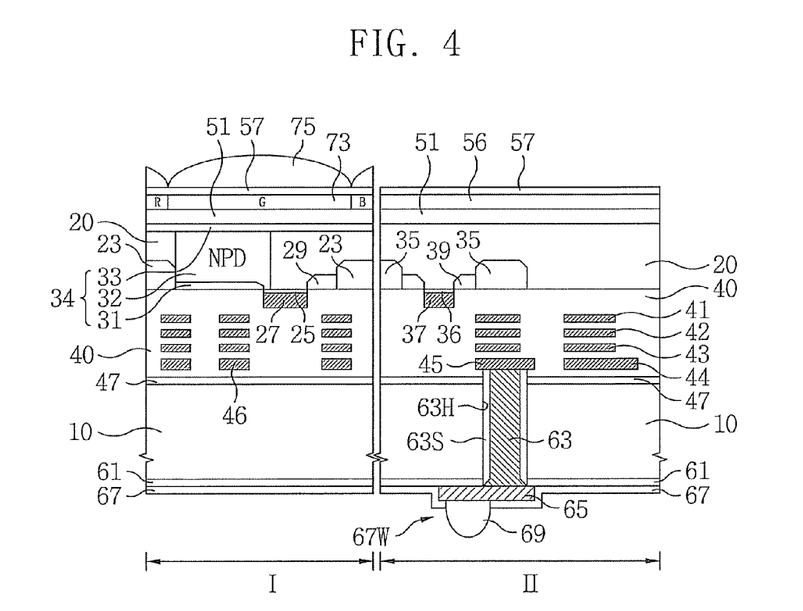

Referring to FIG. 4, a first through hole 63H is formed through the fifth insulating layer 61, the support substrate 10, the bonding layer 47 and a portion of the first insulating layer 40 between the lower input/output pad 65 and the first conductive pattern 45. A first insulating spacer 63S covers sidewalls of the first through hole 63H. The first through electrode 63 is formed to fill (e.g., completely fill) the first through hole 63H. The first through electrode 63 is arranged in the second region II. In at least this example embodiment, the second through electrode (53 of FIG. 2) is omitted.

Figure 5:
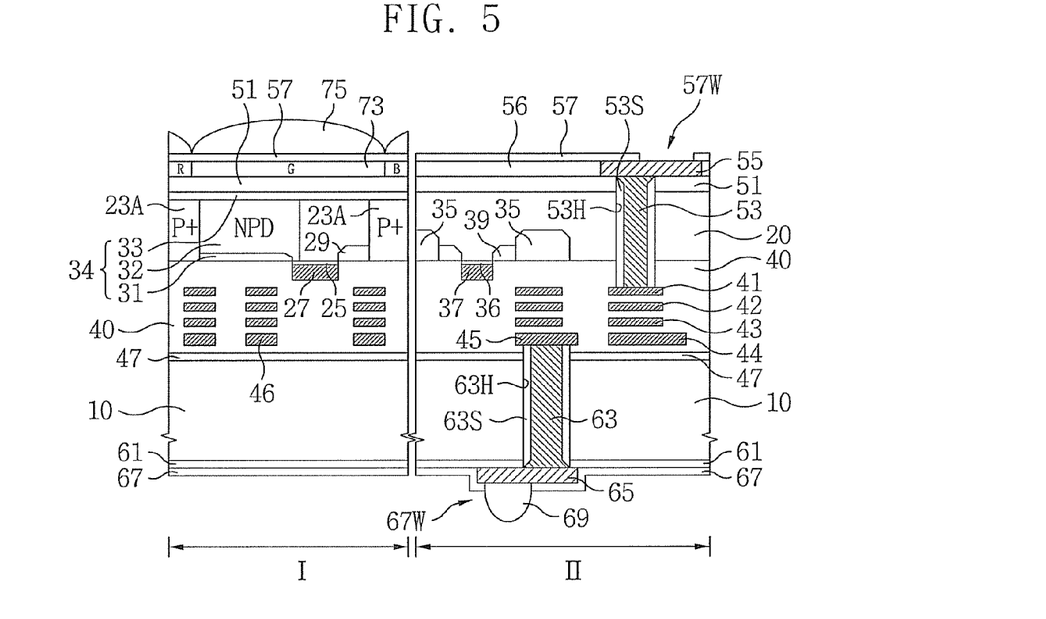

Referring to FIG. 5, in this example embodiment, the photodiode 34 and the floating diffusion region 29 are defined by a first isolation region 23A. The first isolation region 23A may be formed of a semiconductor having p-type impurities. The first isolation region 23A contacts sidewalls of the first PPD region 31 and the NPD region 32. The first isolation region 23A is formed between the second PPD region 33 and the first insulating layer 40.

Figure 6:
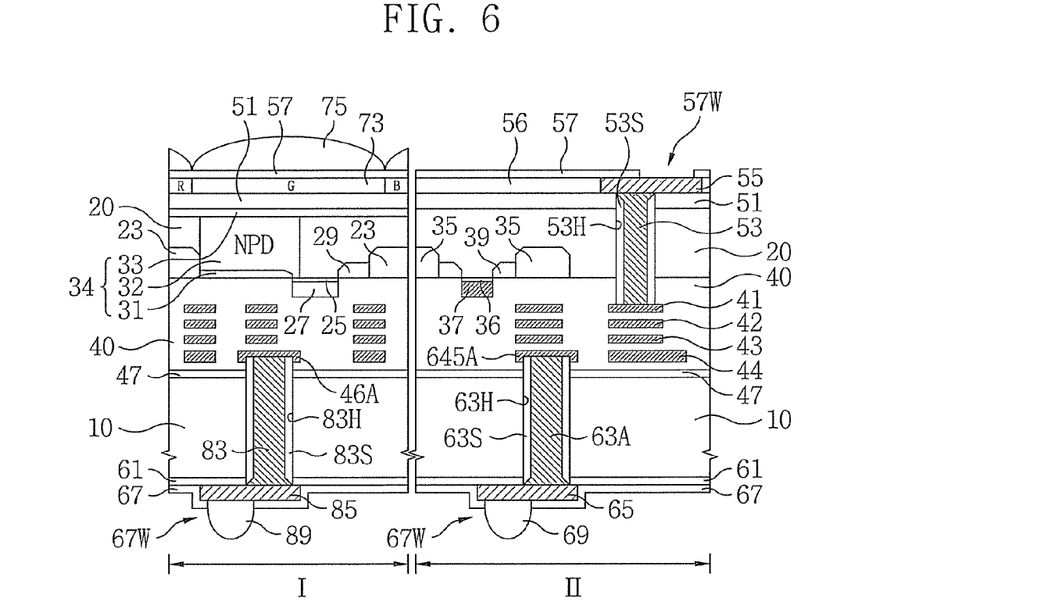
FIGS. 6 to 8 are cross-sectional views of semiconductor devices according to still other example embodiments of inventive concepts.
Figure 7:
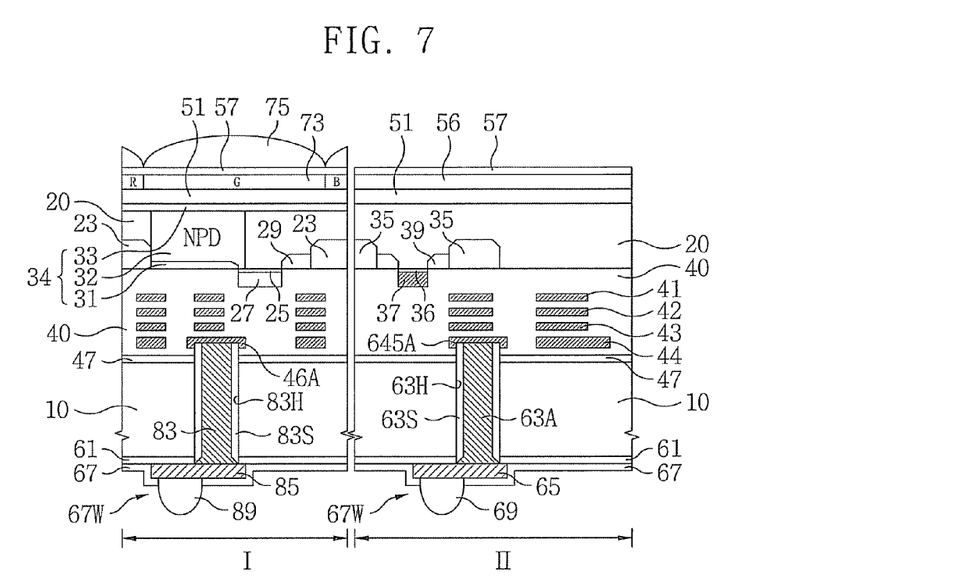
Figure 8:
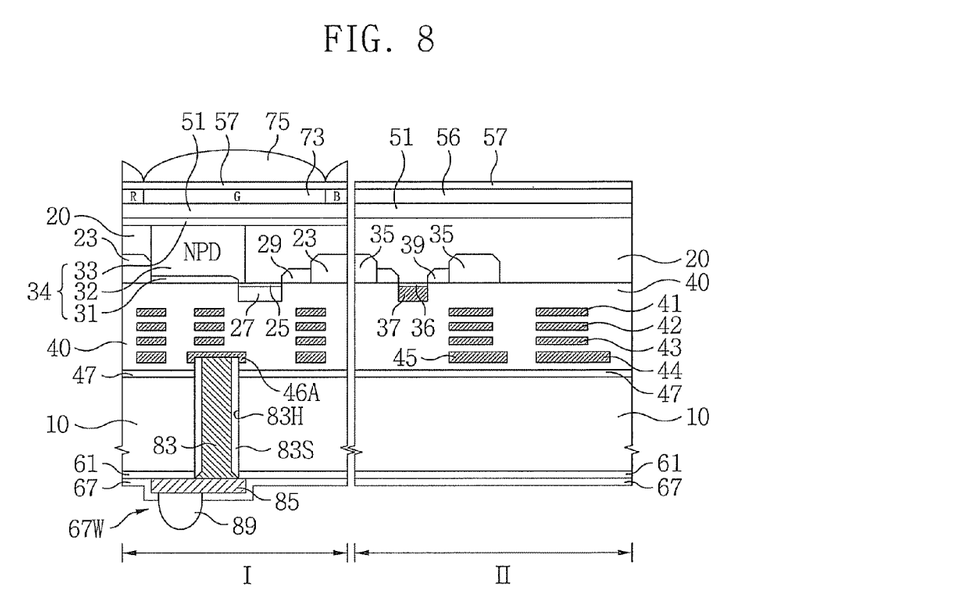

FIGS. 6 to 8 are cross-sectional views of semiconductor devices according to still other example embodiments of inventive concepts.

The example embodiment shown in FIG. 6 is similar to the example embodiment shown in FIG. 2, and thus, the description of this example embodiment will focus on the differences between these example embodiments.

Referring to FIG. 6, the first through electrode 63A and the second through electrode 53 are disposed in the second region II as in the example embodiment shown in FIG. 2. The first lower input/output pad 65 contacts the first through electrode 63A, and an upper input/output pad 55 contacts the second through electrode 53. A first contact portion 69 contacts the first lower input/output pad 65.

A plurality of conductive patterns 41, 42, 43, 44, 645A, and 46A are provided in the first insulating layer 40. In this example, the conductive pattern 41 is referred to as the first conductive pattern 41.

The conductive patterns 41, 42, 43, 44, 645A, and 46A include a first conductive pattern 41, a second conductive pattern 42, a third conductive pattern 43, a fourth conductive pattern 44, a fifth conductive pattern 645A and a sixth conductive pattern 46A. The sixth conductive pattern 46A is disposed in the first region I.

In the first region I, a third through hole 83H is formed through the fifth insulating layer 61, the support substrate 10, the bonding layer 47 and a portion of the first insulating layer 40 between the second lower input/output pad 85 and the sixth conductive pattern 46A. A surface of the sixth conductive pattern 46A is partially recessed by the third through hole 83H. A third insulating spacer 83S covers sidewalls of the third through hole 83H. The third through electrode 83 is formed to fill (e.g., completely fill) the third through hole 83H. In this example, the third insulating spacer 83S surrounds sidewalls of the third through electrode 83, and the third insulating spacer 83S separates the third through electrode 83 from the support substrate 10 between the second lower input/output pad 85 and the sixth conductive pattern 46A. The third through electrode 83, the second lower input/output pad 85 and the second contact portion 89 are arranged in the first region I.

The example embodiment shown in FIG. 7 is similar to the example embodiment shown in FIG. 6, except that the second through electrode 53 is omitted. The example embodiment shown in FIG. 8 is also similar to the example embodiment shown in FIG. 6, except that the second through electrode 53 and the first through electrode 63 are omitted.

Referring to FIG. 7, the third through electrode 83 is disposed in the first region I, and the first through electrode 63A is disposed in the second region II as in FIG. 6. However, the second through electrode (53 of FIG. 6) is omitted.

Referring to FIG. 8, the third through electrode 83 is disposed in the first region I, but the first through electrode (63A of FIG. 7) and the second through electrode (53 of FIG. 6) are omitted. Thus, the example embodiment shown in FIG. 8 is similar to the example embodiment shown in FIG. 7, except that the first through electrode 63A is omitted.

Figure 9:
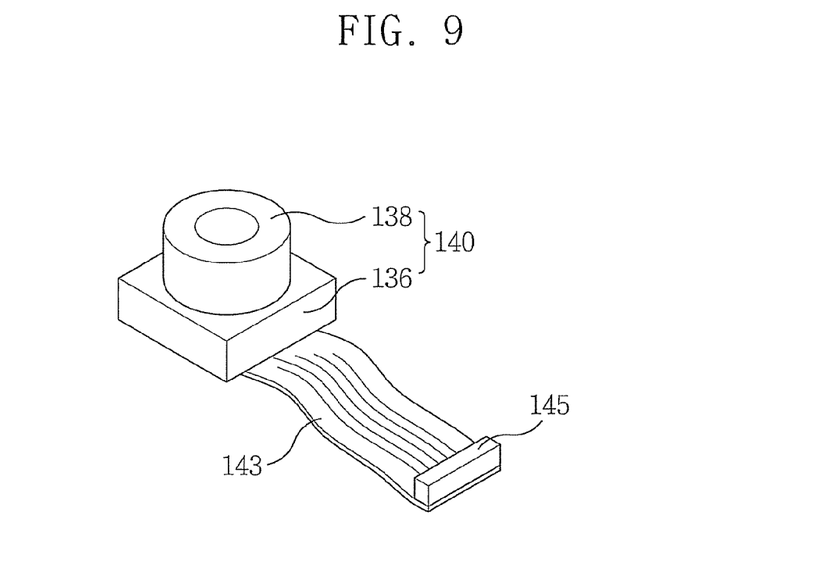
FIG. 9 is a perspective view of a camera module including a semiconductor device according to an example embodiment of inventive concepts.
Figure 10:
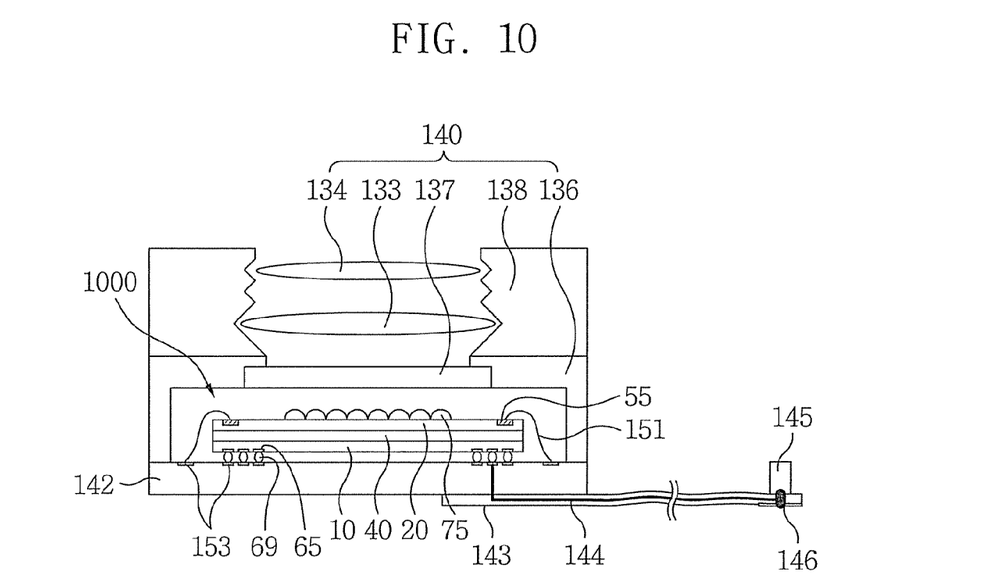
FIGS. 10 to 12 are cross-sectional views of camera modules according to example embodiments of inventive concepts.
Figure 11:
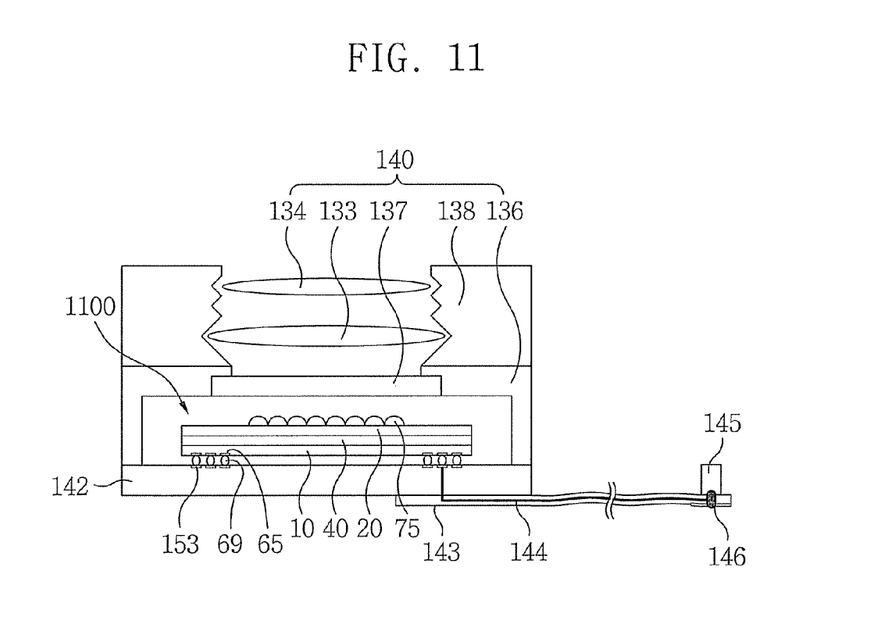
Figure 12:
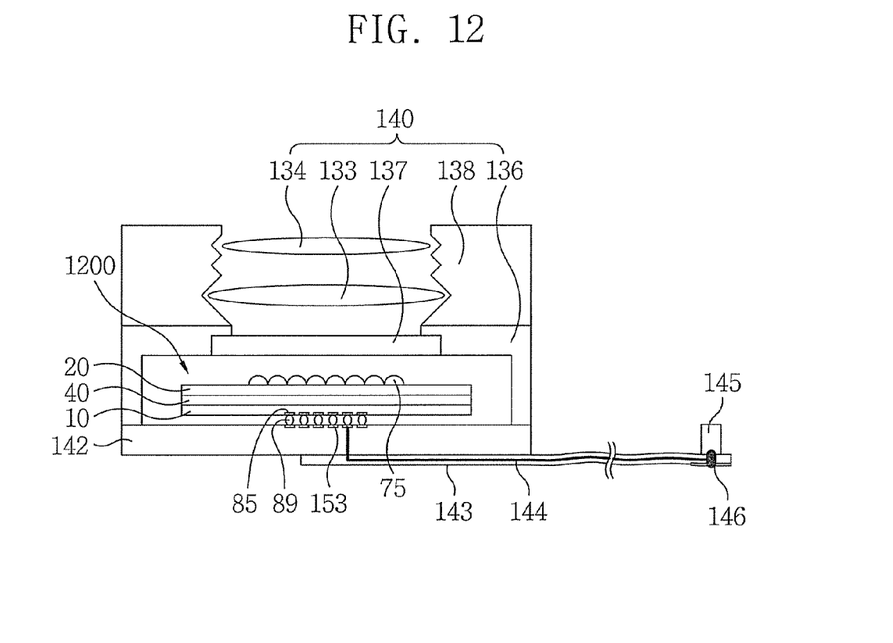

FIG. 9 is a perspective view of a camera module employing a semiconductor device according to an example embodiment of inventive concepts. FIGS. 10 to 12 are cross-sectional views of camera modules according to example embodiments.

Referring to FIGS. 9 and 10, the camera module includes a case 140, printed circuit boards 142 and 143 and a semiconductor device 1000. The semiconductor device 1000 may be backside illuminated image sensors having a structure similar or substantially similar to that described with reference to FIGS. 1 to 8. Although only a single semiconductor device 1000 is shown in FIG. 10, the camera module may include a plurality of semiconductor devices 1000.

The case 140 includes a sensor case 136 having a light transmitting window 137, and a lens holder 138 mounted on the sensor case 136. First and second lenses 133 and 134 are disposed in the lens holder 138. The sensor case 136 is mounted on the first printed circuit board 142. A second printed circuit board 143 contacts a surface of the first printed circuit board 142. External terminals 145 and 146 are provided on one end of the second printed circuit board 143.

The semiconductor device 1000 is mounted on the first printed circuit board 142. The semiconductor device 1000 shown in FIG. 10 includes a support substrate 10, a semiconductor substrate 20, a first insulating layer 40, upper input/output pads 55, lower input/output pads 65, contact portions 69 and micro-lenses 75.

The semiconductor device 1000 may include components similar or substantially similar to those described with reference to FIGS. 1 to 8, but the majority of the components are omitted for convenience. The micro-lenses 75 are arranged in the light transmitting window 137. That is, for example, the light transmitting window 137 is arranged on the photodiode (34 of one or more FIGS. 1 to 8).

The contact portions 69 are connected to bond pads/fingers 153 formed in the first printed circuit board 142. The upper input/output pads 55 are connected to the bond pads 153 via connection portions 151. The bond pads 153 are electrically connected to the external terminals 145 and 146 via an internal interconnection 144 in the first and second printed circuit boards 142 and 143. The external terminals 145 and 146 include a multi-connector and/or a multi-tap 146.

In accordance with at least some alternative example embodiments, the second printed circuit board 143 is omitted. Furthermore, the first printed circuit board 142 may include other external terminals such as a ball grid array (BGA), a lead grid array (LGA), a pin grid array (PGA), a combination thereof or the like.

The first and second printed circuit boards 142 and 143 may be a rigid printed circuit board, a flexible printed circuit board or a rigid-flexible printed circuit board. For example, the first printed circuit board 142 may be a rigid printed circuit board, and the second printed circuit board 143 may be a flexible printed circuit board. The contact portions 69 may be formed of a conductive bump, a solder ball, an ACP, an ACF, an NCP, an NCF, a combination thereof or the like. The connection portions 151 may be formed of a bonding wires, beam leads, conductive tape, a combination thereof or the like.

As described above, the semiconductor device 1000 are configured to input/output an electrical signal via the contact portions 69 and the connection portions 151. The disposition of the through electrode (63 of FIG. 1, 63A of FIGS. 2, and 63B of FIG. 3) may increase integration density relative to the conventional art. Also, a shortened path for transmitting electrical signals may improve (e.g., significantly improve) operating speed of the camera module.

Referring to FIG. 11, a semiconductor device 1100 is mounted on a first printed circuit board 142. The semiconductor device 1100 has a structure similar or substantially similar to that of FIG. 4. In this example, an upper input/output pad (55 of FIG. 1) and a connection portion (151 of FIG. 10) are omitted.

Referring to FIG. 12, a semiconductor device 1200 is mounted on a first printed circuit board 142. The semiconductor device 1200 has a structure similar or substantially similar to that of FIG. 8. As illustrated in FIG. 8, second lower input/output pads 85 and second contact portions 89 may be arranged between micro-lenses 75 and the first printed circuit board 142. In this example, an upper input/output pad (55 of FIG. 1), a connection portion (151 of FIG. 10), and a first lower input/output pad (65 of FIG. 1) are omitted.

Figure 13:
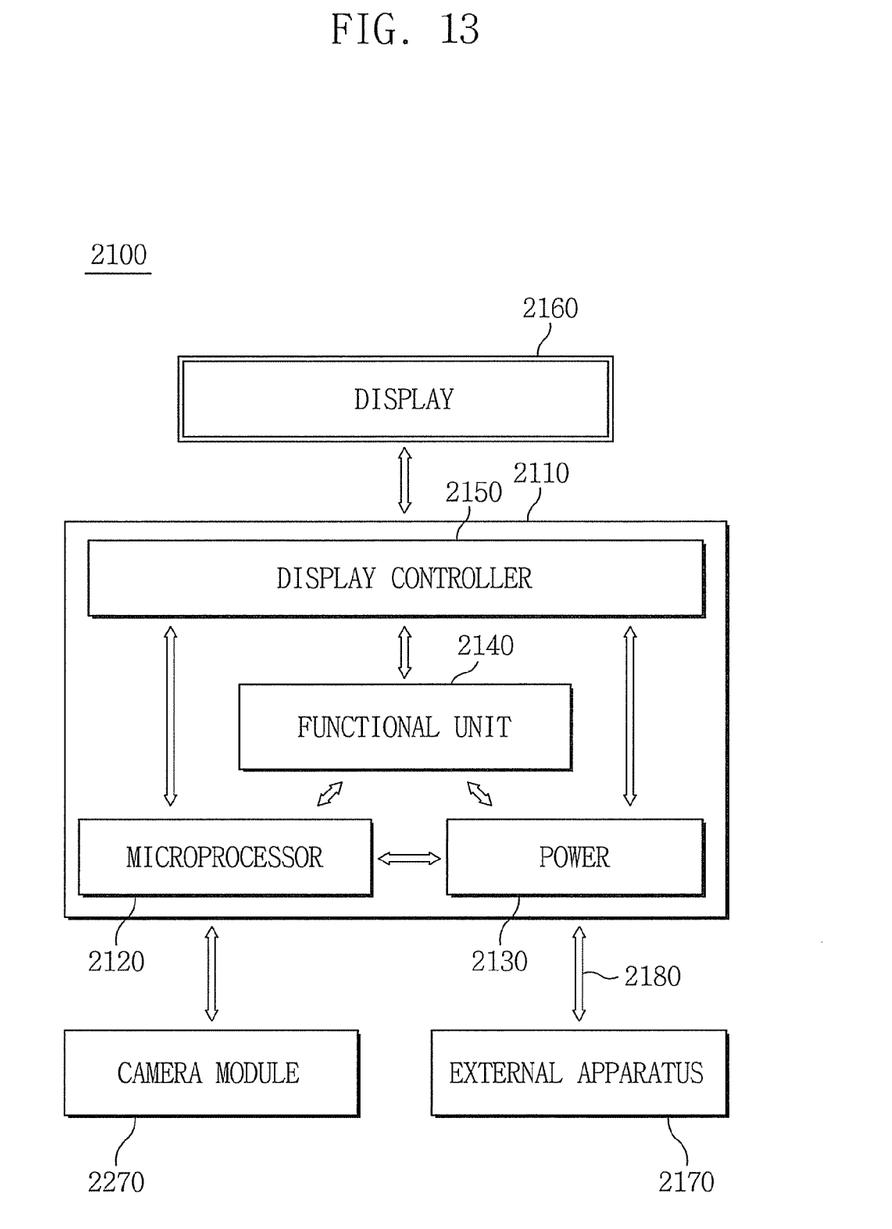
FIG. 13 is a block diagram of an electronic device according to an example embodiment of inventive concepts.

FIG. 13 is a block diagram of an electronic device according to an example embodiment of inventive concepts.

Referring to FIG. 13, the electronic system 2100 includes a body 2110, a micro processor unit (or circuit) 2120, a power unit (or circuit) 2130, a functional unit (or circuit) 2140, and a display controller unit (or circuit) 2150. The body 2110 may be a mother board formed of a printed circuit board (PCB). The micro processor unit 2120, the power unit 2130, the functional unit 2140 and the display controller unit 2150 are mounted on the body 2110. The electronic system 2100 further includes a display unit 2160 and/or a camera module 2270 mounted in or outside (external to) the body 2110. For example, the display unit 2160 may be disposed on a surface of the body 2110 to display an image processed by the display controller unit 2150.

The power unit 2130 is supplied with a given, desired or predetermined power from an external battery (not shown). The power unit 2130 divides the voltage into required voltage levels and supplies the divided voltages to the micro processor unit 2120, the functional unit 2140 and the display controller unit 2150. The micro processor unit 2120 is supplied with a voltage from the power unit 2130 to control the functional unit 2140 and the display unit 2160. The functional unit 2140 performs various operations of the electronic system 2100. For example, if the electronic device 2100 is a cellular phone, the functional unit 2140 may include various components capable of functioning as a cellular phone such as dialing, outputting an image on the display unit 2160 as a result of communication with an external apparatus 2170, and outputting voice through a speaker, and it may function as a camera image processor.

According to at least some example embodiments, if the electronic device 2100 is connected to a memory card for capacity expansion, the functional unit 2140 may be a memory card controller. In this example, functional unit 2140 transmits and receives signals to and from the external apparatus 2170 through a wired or wireless communication unit 2180. Furthermore, when the electronic device 2100 requires a universal serial bus (USB) for capacity expansion, the functional unit 2140 may be an interface controller.

The camera module 2270 may have a structure the same as or substantially similar to the camera modules shown and described with regard to FIGS. 9 to 12. The external terminals (145 and 146 of FIG. 10) are connected to the body 2110. The camera module 2270 may include one or more semiconductor devices similar or substantially similar to that described with reference to FIGS. 1 to 8.

FIGS. 14 to 20 are cross-sectional views illustrating a method of fabricating a semiconductor device according to an example embodiment of inventive concepts.

Figure 14:
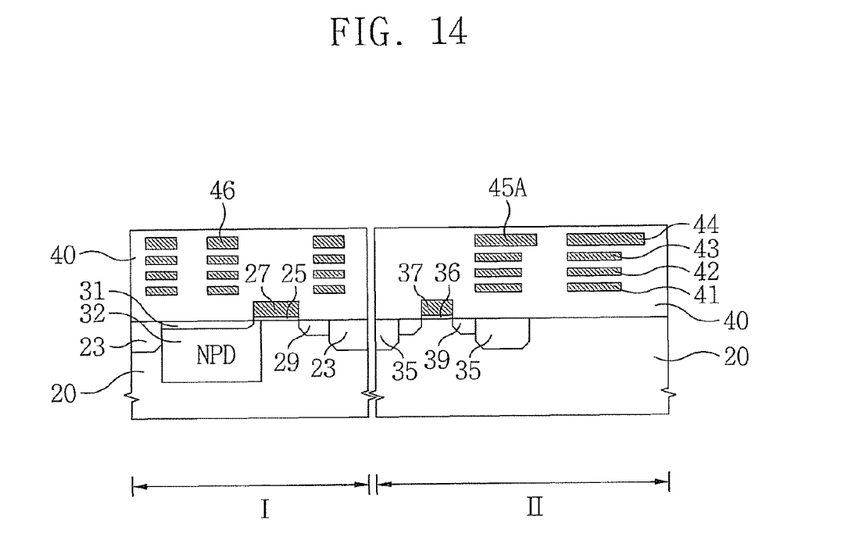
FIGS. 14 to 20 are cross-sectional views illustrating a method of fabricating a semiconductor device according to an example embodiment of inventive concepts.

Referring to FIG. 14, a first isolation region 23 and a second isolation region 35 are respectively formed in a first region I and a second region II of a semiconductor substrate 20. A first gate dielectric layer 25 and a first gate electrode 27 are sequentially formed on the semiconductor substrate 20 in the first region I. A second gate dielectric layer 36 and a second gate electrode 37 are sequentially formed on the semiconductor substrate 20 in the second region II. An NPD region 32 and a first PPD region 31 are formed in the semiconductor substrate 20 adjacent to a first sidewall of the first gate electrode 27. A floating diffusion region 29 is formed in the semiconductor substrate 20 adjacent to a second sidewall of the first gate electrode 27. Source and drain regions 39 are formed in the semiconductor substrate 20 adjacent to respective sides of the second gate electrode 37.

A first insulating layer 40 is formed on the semiconductor substrate 20, and conductive patterns 41, 42, 43, 44, 45A and 46 are formed in the first insulating layer 40. In this example, the conductive patter 41 is referred to as the first conductive pattern 41 and the conductive patterns 41, 42, 43, 44, 45A and 46 include the first conductive pattern 41, a second conductive pattern 42, a third conductive pattern 43, a fourth conductive pattern 44, a fifth conductive pattern 45A and a sixth conductive pattern 46. The conductive patterns 41, 42, 43, 44, 45A and 46 are covered with the first insulating layer 40.

Figure 15:
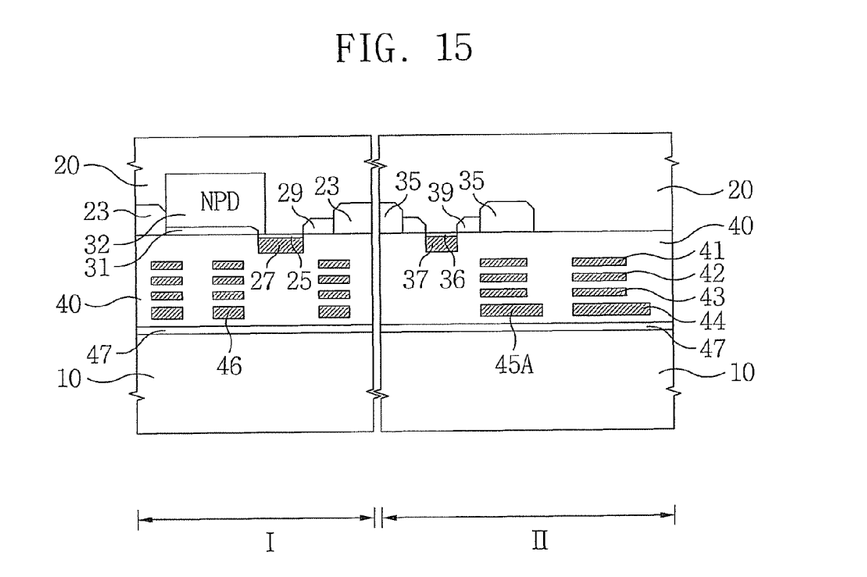

Referring to FIG. 15, the semiconductor substrate 20 and the first insulating layer 40 are bonded to a support substrate 10 using a bonding layer 47. The bonding layer 47 may be a silicon oxide layer. The bonding layer 47 is in contact with the support substrate 10 and the first insulating layer 40. The fourth conductive pattern 44, the fifth conductive pattern 45A and the sixth conductive pattern 46 are closer to the support substrate 10. The first conductive pattern 41 is closer (e.g., adjacent) to the semiconductor substrate 20.

Figure 16:
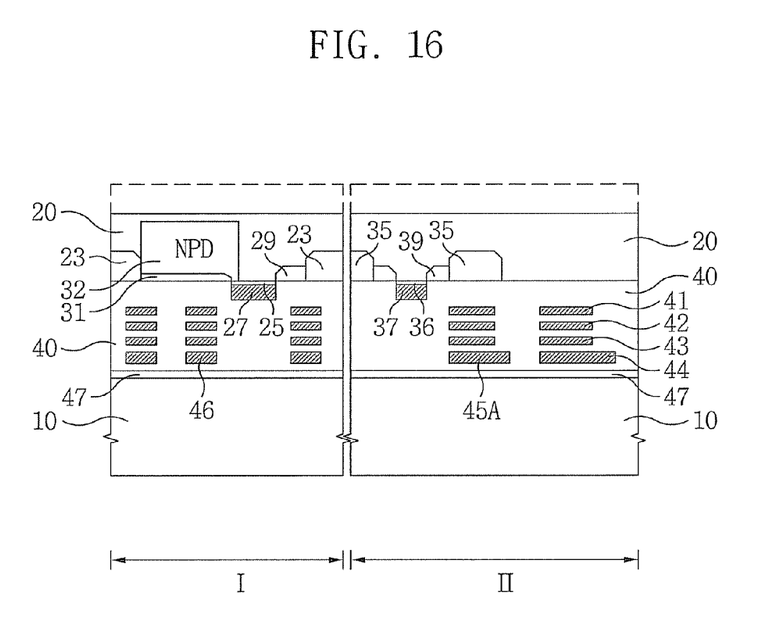

Referring to FIG. 16, a surface portion of the semiconductor substrate 20 is partially removed to reduce its thickness. The semiconductor substrate 20 remains on the NPD region 32. The NPD region 32 and the first PPD region 31 remain in the semiconductor substrate 20.

Figure 17:
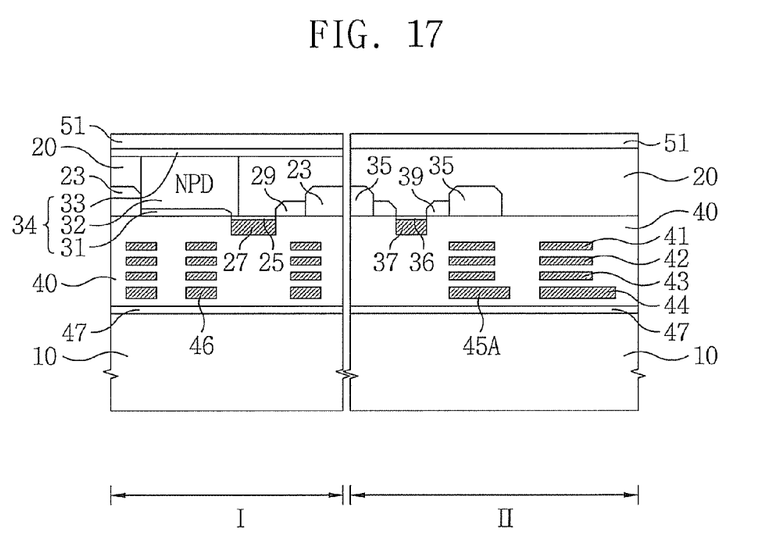

Referring to FIG. 17, a second PPD region 33 is formed in the semiconductor substrate 20 in the first region I. The NPD region 32 is between the first PPD region 31 and the second PPD region 33. The NPD region 32 contacts the first PPD region 31 and the second PPD region 33. The NPD region 32, the first PPD region 31 and the second PPD region 33 constitute a photodiode 34. A second insulating layer 51 is formed on the semiconductor substrate 20. The semiconductor substrate 20 is interposed between the first insulating layer 40 and the second insulating layer 51. The second insulating layer 51 covers the second PPD region 33.

Figure 18:
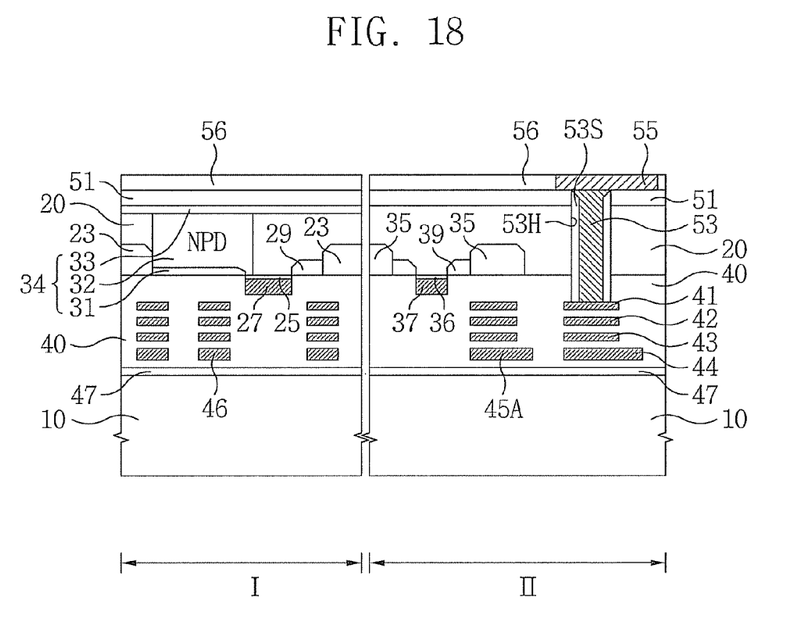

Referring to FIG. 18, in the second region II, a second through hole 53H is formed through the second insulating layer 51, the semiconductor substrate 20 and a portion of the first insulating layer 40 to the first conductive pattern 41. A second insulating spacer 53S is formed to cover sidewalls of the second through hole 53H. A second through electrode 53 is formed to fill (e.g., completely fill) the second through hole 53H. A fourth insulating layer 56 is formed on the second insulating layer 51. An upper input/output pad 55 is formed in the fourth insulating layer 56 to contact the second through electrode 53.

Figure 19:
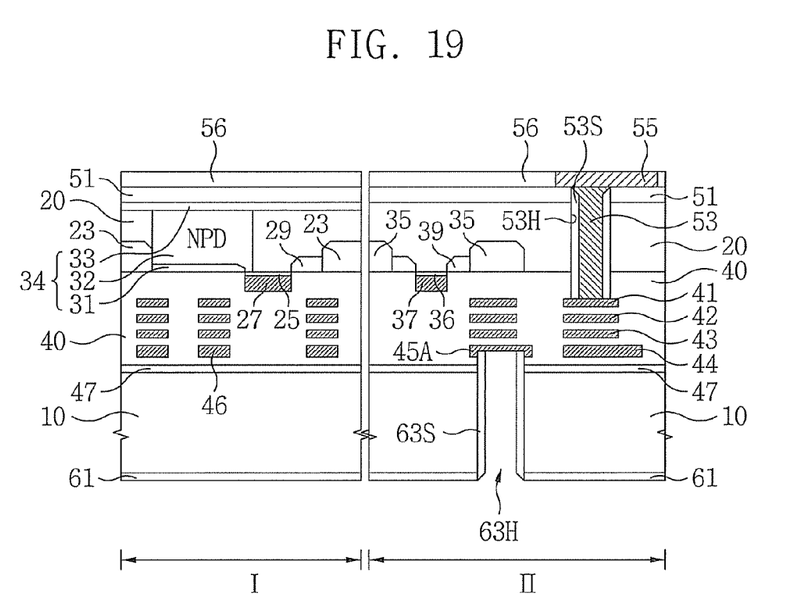

Referring to FIG. 19, a fifth insulating layer 61 is formed to cover a surface of the support substrate 10. The support substrate 10 is interposed between the first insulating layer 40 and the fifth insulating layer 61. A first through hole 63H is formed through the fifth insulating layer 61, the support substrate 10, the bonding layer 47 and a portion of the first insulating layer 40 to the fifth conductive pattern 45A. The first through hole 63H also penetrates a surface portion of the fifth conductive pattern 45A so as to partially recess the surface of the fifth conductive pattern 45A. A first insulating spacer 63S is formed to cover sidewalls of the first through hole 63H.

Figure 20:
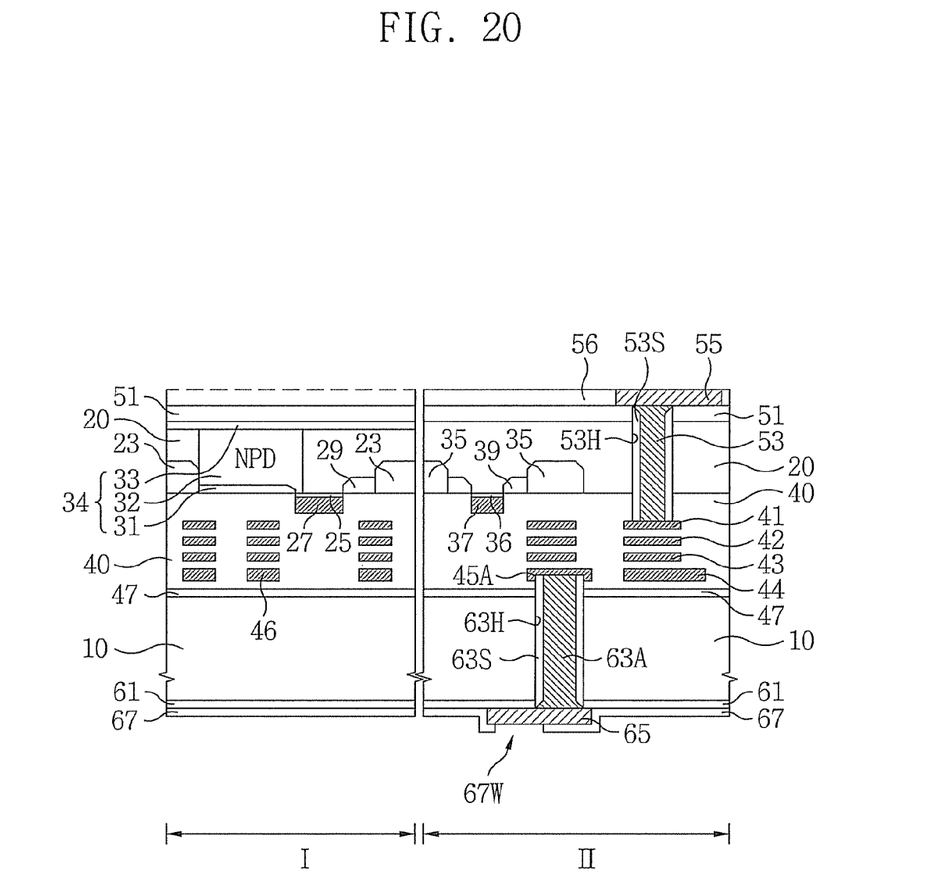

Referring to FIG. 20, a first through electrode 63A is formed to fill (e.g., completely fill) the first through hole 63H. A lower input/output pad 65 is formed on the fifth insulating layer 61 to contact the first through electrode 63A. A sixth insulating layer 67 is formed on the fifth insulating layer 61. The sixth insulating layer 67 partially covers the lower input/output pad 65. An opening 67W partially exposing the lower input/output pad 65 is formed in the sixth insulating layer 67. The fourth insulating layer 56 is partially removed to expose the second insulating layer 51 in the first region I.

A third insulating layer 57 on an upper surface of the fourth insulating layer 56 and a portion of the upper input/output pad 55.

A contact portion 69, color filters 73 and micro-lenses 75 are then formed in a manner similar or substantially similar to that shown in FIG. 2.

As described above, the first through electrode 63A and the second through electrode 53 may be formed after combining the support substrate 10 with the semiconductor substrate 20. In at least some alternative example embodiments, at least one of the first through electrode 63A and the second through electrode 53 may be formed prior to combining the support substrate 10 with the semiconductor substrate 20.

According to at least some example embodiments of inventive concepts, a through electrode is formed through a support substrate and another through electrode is formed through a semiconductor substrate attached to the support substrate. The through electrode formed through the support substrate is disposed in at least one of a logic region and a pixel region of a semiconductor device having a backside illuminated image sensor. As a result, semiconductor devices according to at least some example embodiments may have improved integration density compared to the conventional art. Furthermore, a signal transmission path via the first through electrode may be reduced (e.g., significantly reduced) compared to the conventional art. Consequently, semiconductor devices having relatively high integration density and/or relatively high operating speeds may be implemented.

The foregoing is illustrative of example embodiments and is not to be construed as limiting thereof. Only some example embodiments have been described, those skilled in the art will readily appreciate that many modifications are possible in example embodiments without materially departing from the novel teachings and advantages. Accordingly, all such modifications are intended to be included within the scope of inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific example embodiments disclosed, and that modifications to the disclosed embodiments, as well as other example embodiments, are intended to be included within the scope of the appended claims.

What is claimed is:

1. An image sensor comprising:
    a support substrate;
    an insulating layer on the support substrate;
    a semiconductor substrate including a photodiode on the insulating layer;
    a first conductive pattern disposed in the insulating layer;
    a first through electrode penetrating the support substrate to contact the first conductive pattern;
    a floating diffusion region adjacent to the photodiode in the semiconductor substrate; and
    a gate electrode disposed in the insulating layer; wherein
        the floating diffusion region is separated from the photodiode, and
        the gate electrode is arranged between the photodiode and the floating diffusion region.

2. The image sensor of claim 1, wherein the photodiode is formed in a pixel region of the semiconductor substrate, and wherein the first through electrode is arranged in a logic region of the semiconductor substrate, and the logic region is adjacent to the pixel region.

3. The image sensor of claim 2, further comprising:
    a lower input/output pad formed on the support substrate and connected to the first through electrode; wherein the first through electrode is disposed between the lower input/output pad and the first conductive pattern.

4. The image sensor of claim 2, further comprising:
a second conductive pattern disposed in the insulating layer;
a second through electrode penetrating the semiconductor substrate to contact the second conductive pattern; and
an upper input/output pad formed on the semiconductor substrate and connected to the second through electrode; wherein
the second through electrode is disposed between the upper input/output pad and the second conductive pattern, and
the second through electrode is arranged in the logic region of the semiconductor substrate.

5. The image sensor of claim 4, wherein the first through electrode is separated from the semiconductor substrate, and the second through electrode is separated from the support substrate.

6. The image sensor of claim 4, further comprising:
a third conductive pattern disposed in the insulating layer; and
a third through electrode configured to penetrate the support substrate to contact the third conductive pattern; wherein
the third through electrode is arranged in the pixel region of the semiconductor substrate.

7. An image sensor comprising:
a support substrate;
an insulating layer on the support substrate;
a semiconductor substrate including a photodiode on the insulating layer;
a first conductive pattern disposed in the insulating layer;
a first through electrode penetrating the support substrate to contact the first conductive pattern, the first through electrode also penetrating a portion of the insulating layer between the support substrate and the first conductive pattern, the first through electrode being recessed in a surface of the first conductive pattern; and
an insulating spacer covering sidewalls of the first through electrode; wherein
the insulating spacer extends between the first through electrode and the first conductive pattern.

8. The image sensor of claim 1, wherein the photodiode includes first and second pinned photo diode (PPD) regions having p-type impurities, and an N photo diode (NPD) region having n-type impurities between the first and second PPD regions, wherein the first PPD region is arranged between the NPD region and the insulating layer.

9. The image sensor of claim 8, further comprising:
at least one micro-lens disposed on the photodiode; and
at least one color filter disposed between the at least one micro-lens and the second PPD region.

10. The image sensor of claim 1, further comprising:
an isolation region in the semiconductor substrate, the isolation region contacting the photodiode.

11. The image sensor of claim 10, wherein the isolation region includes a semiconductor having p-type impurities.

12. The image sensor of claim 7, further comprising:
a floating diffusion region adjacent to the photodiode in the semiconductor substrate; and
a gate electrode disposed in the insulating layer; wherein
the floating diffusion region is separated from the photodiode, and
the gate electrode is arranged between the photodiode and the floating diffusion region.

13. The image sensor of claim 1, further comprising:
a bonding layer disposed between the support substrate and the insulating layer, the bonding layer being a silicon oxide layer.

14. A semiconductor device having a photo-sensing region and a logic region adjacent to the photo-sensing region, the semiconductor device comprising:
a support substrate;
an insulating layer on the support substrate;
a semiconductor substrate on the insulating layer, the semiconductor substrate including a photodiode in the photo-sensing region;
a first through electrode formed through the support substrate in the logic region, the first through electrode electrically connecting a first conductive pattern at a first surface of the support substrate with a first input/output pad at a second surface of the support substrate;
a floating diffusion region adjacent to the photodiode in the semiconductor substrate; and
a gate electrode disposed in the insulating layer; wherein
the floating diffusion region is separated from the photodiode, and
the gate electrode is arranged between the photodiode and the floating diffusion region.

15. The semiconductor device of claim 14, wherein the first surface and the second surface are opposite to one another.

16. The semiconductor device of claim 14,
wherein
the first conductive pattern is formed in the insulating layer.

17. The semiconductor device of claim 16, wherein the photodiode includes first and second pinned photodiode regions having a first type of impurity, and a third photodiode region having a second type of impurity, wherein the first and second type of impurities are different, and the third photodiode region is arranged between the first and second pinned photodiode regions, and wherein the first pinned photodiode region is arranged between the third photodiode region and the insulating layer.

18. The semiconductor device of claim 17, further comprising:
at least one micro-lens disposed on the photodiode; and
at least one color filter disposed between the at least one micro-lens and the second pinned photodiode region.

19. The semiconductor device of claim 14, wherein the first through electrode is recessed in a surface of the first conductive pattern.

20. The semiconductor device of claim 1, further comprising:
a bonding layer disposed on the support substrate;
a second conductive pattern disposed in the insulating layer; and
a second through electrode penetrating the semiconductor substrate to contact the second conductive pattern; wherein
the insulating layer is disposed on the bonding layer.

* * * * *